United States Patent [19]
Tamura et al.

[11] Patent Number: 5,313,074
[45] Date of Patent: May 17, 1994

[54] JOSEPHSON DEVICE FORMED OVER A RECESS STEP WITH PROTECTIVE LAYER

[75] Inventors: Itsuro Tamura, Kawachinagano; Satoshi Fujita; Masao Wada, both of Osaka, all of Japan

[73] Assignee: Osaka Gas Company Limited, Osaka, Japan

[21] Appl. No.: 799,272

[22] Filed: Nov. 27, 1991

[51] Int. Cl.$^5$ .............. H01L 39/22; H01B 12/00; C23C 14/00; G11C 11/44
[52] U.S. Cl. .................. 257/34; 257/35; 505/817; 505/832; 505/162
[58] Field of Search .............. 357/5; 505/1, 817, 832; 427/62; 257/34, 35

[56] References Cited
U.S. PATENT DOCUMENTS

| | | |
|---|---|---|
| 4,464,522 | 6/1984 | de Lozanne .................. 257/34 |
| 5,053,383 | 10/1991 | Short et al. .................. 357/5 |
| 5,057,485 | 10/1991 | Nishino et al. .................. 357/5 |
| 5,061,971 | 10/1991 | Takemura et al. .................. 357/5 |

FOREIGN PATENT DOCUMENTS

| | | |
|---|---|---|
| 0291050A2 | 11/1988 | European Pat. Off. . |
| 52-69297 | 6/1977 | Japan .................. 357/5 |
| 56-87387 | 7/1981 | Japan .................. 357/5 |
| 58-32480 | 2/1983 | Japan .................. 357/5 |
| 58-0151934 | 8/1983 | Japan . |

OTHER PUBLICATIONS

Meyer et al., "Spectroscopic evidence for passivation of the LaSrCuO surface with gold", Appl. Phys. Lett., vol. 51, #14, Oct. 5, 1987., pp. 1118–1120.
Chien et al., "Effect of metal buffer layers on superconducting YBaCuO thin films," App. Phys. Lett., vol. 51, #25, Dec. 21, 1987., pp. 2155–2157.
Bansal et al., "Chemical durability of high-temperature superconducting YBaCuO in aqueous environment," App. Phys. Lett., vol. 52, #4, Jan. 25, 1988. pp. 323–325.
Dilorio et al., "Practical high $T_c$ Josephson junctions and dc SQUIDs operating above 85K", Appl. Phys. Lett., vol. 58, #22, Jun. 3, 1991, pp. 2552–2554.
"Improved Fabrication Method of the Microbridge Utilizing Step Edge", Japanese Journal of Applied Physics, vol. 25, No. 7, Jul. 1986, pp. 1006–1010, Nakanishi et al.
"Extension of the bi-epitaxial Josephson junction process to various substrates", Colclough et al., 1991 Amer. Institute of Physics, Oct. 21, 1991, pp. 2177–2179.
Spring Meeting, the 37th Japan Society of Applied Physics and related Societies (Mar. 28, 1990) with a translation thereof.
DC Squid with Variable Thickness Bridge, Physica B 165 & 166 (1990) 78–80 North-Holland.

*Primary Examiner*—Rolf Hille
*Assistant Examiner*—Mahshid Saadat
*Attorney, Agent, or Firm*—Wenderoth, Lind & Ponack

[57] ABSTRACT

In a Josephson device which can be employed as a sensor including superconductor for measuring an extremely weak magnetic field, a Josephson junction consisting of superconducting material is formed, and a covering layer consisting of ordinary conducting metal or semiconductor is formed on the Josephson junction. This enables the Josephson junction to be isolated from the oxidized atmosphere. Further, the covering layer is not to present any deterioration such as cracks even upon being subjected to a thermal hysteresis from very low temperature to ordinary temperature.

20 Claims, 14 Drawing Sheets

Fig. 2 (1)
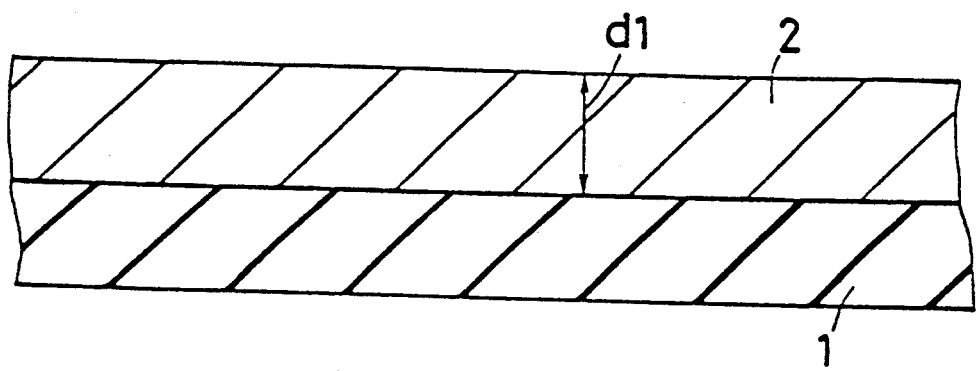
Fig. 2 (2)
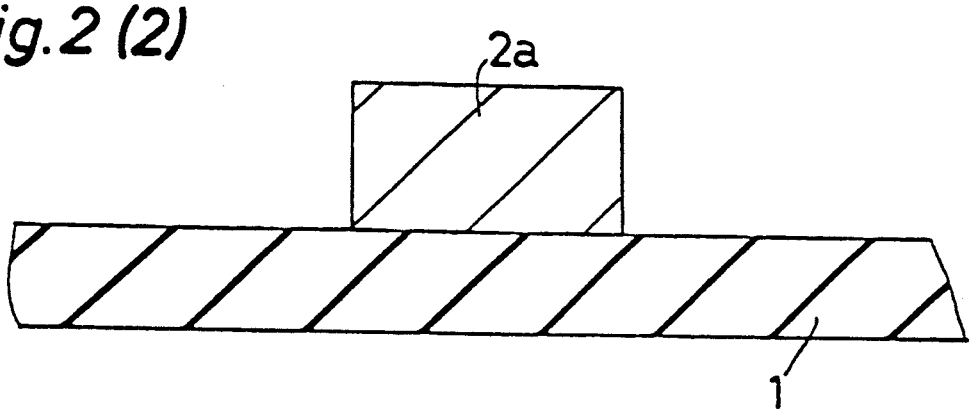
Fig. 2 (3)
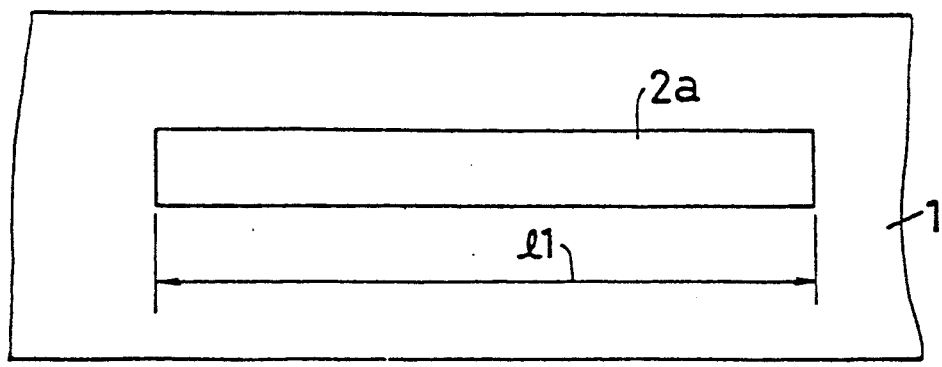

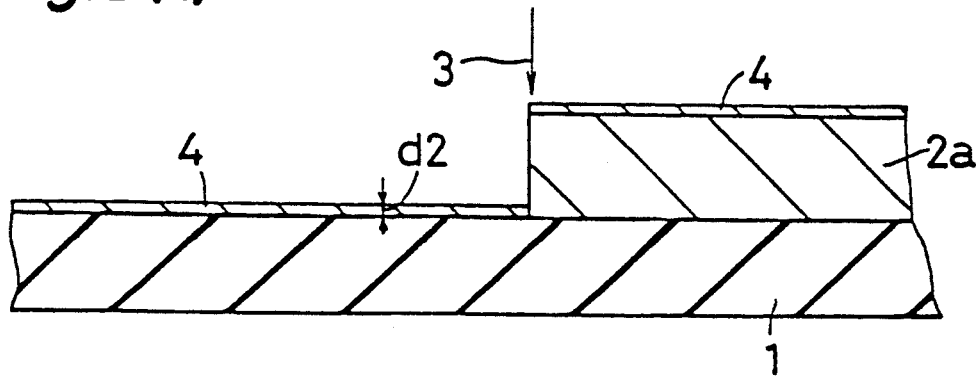
Fig.2 (4)
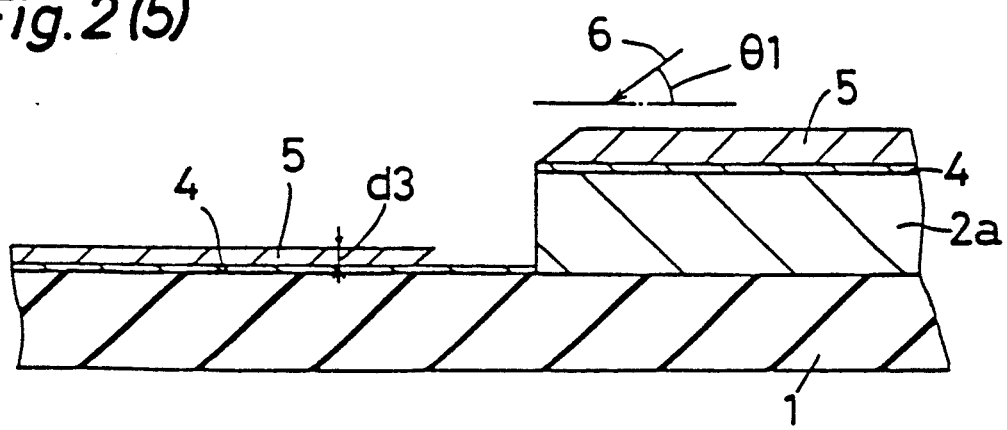
Fig.2 (5)
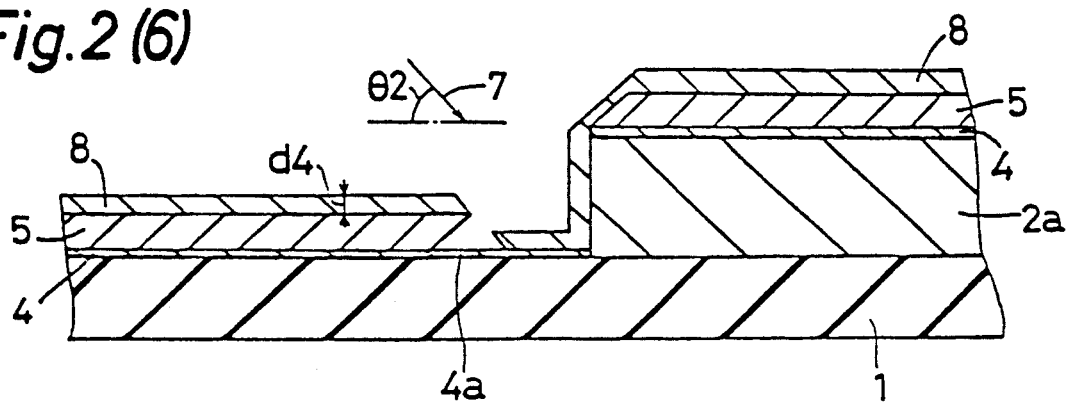
Fig.2 (6)

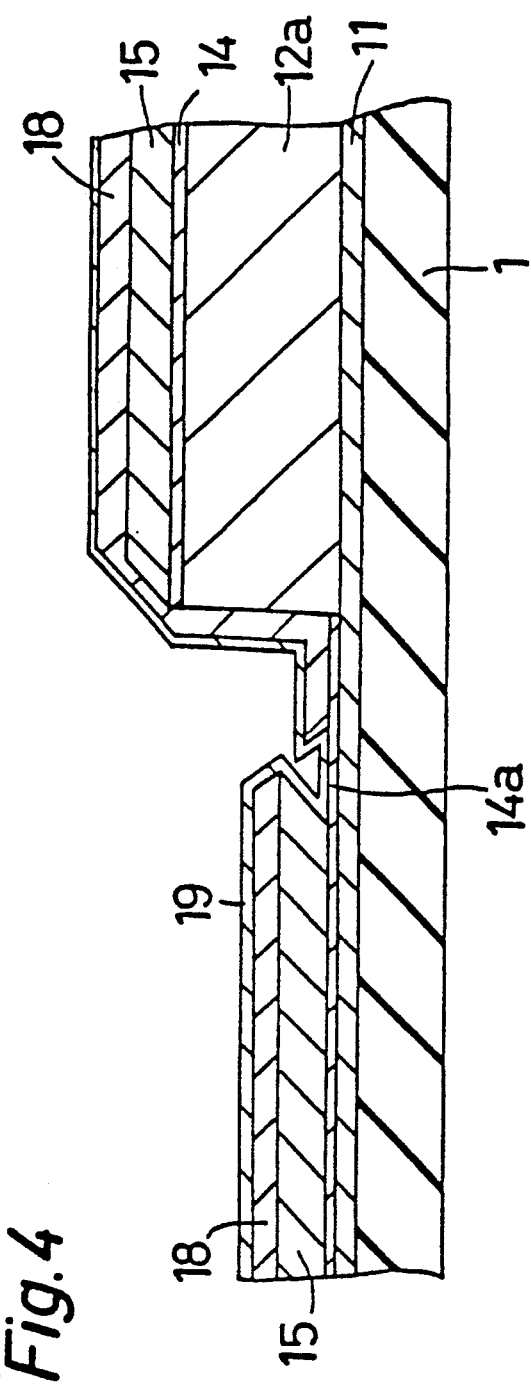

Fig.5 (1)
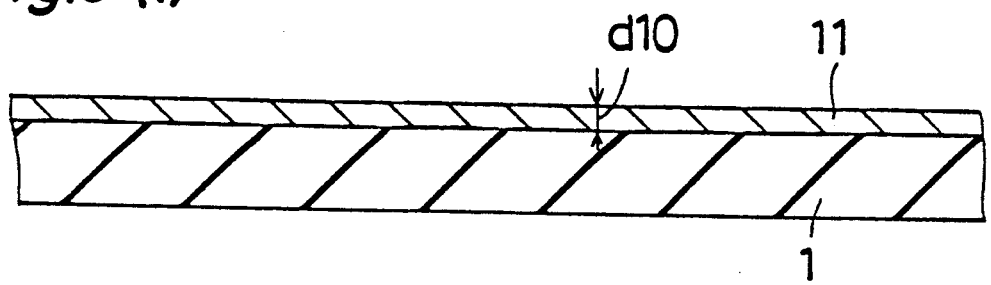
Fig.5 (2)
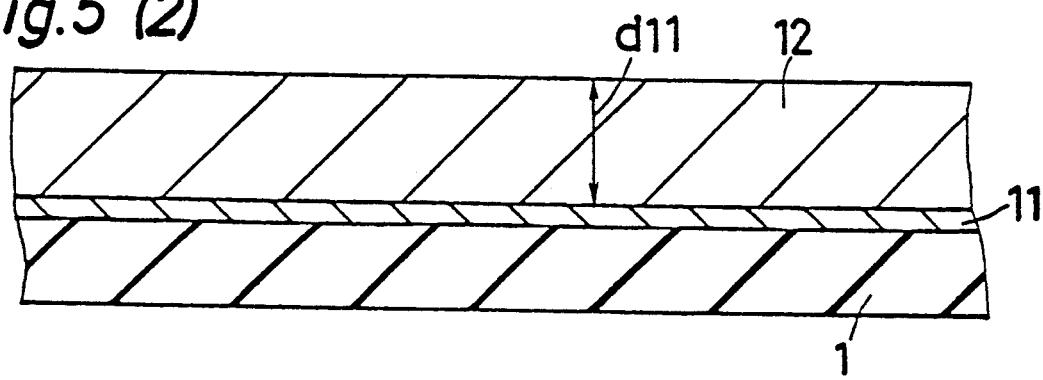
Fig.5 (3)
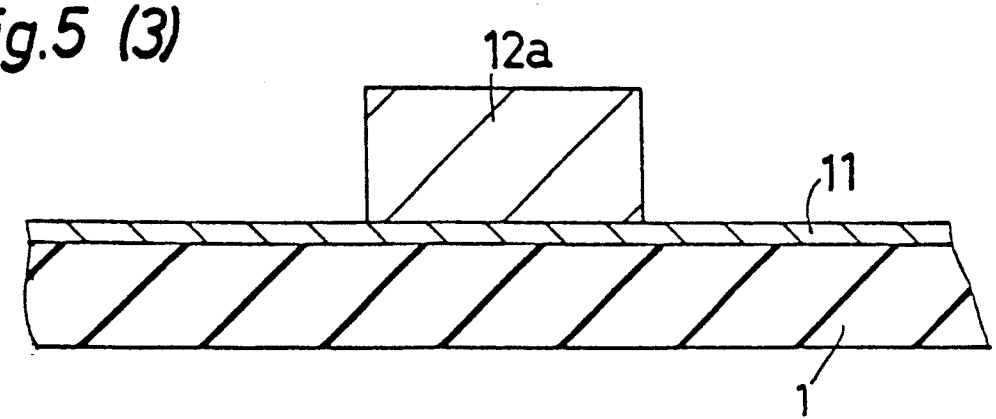

Fig.5 (4)
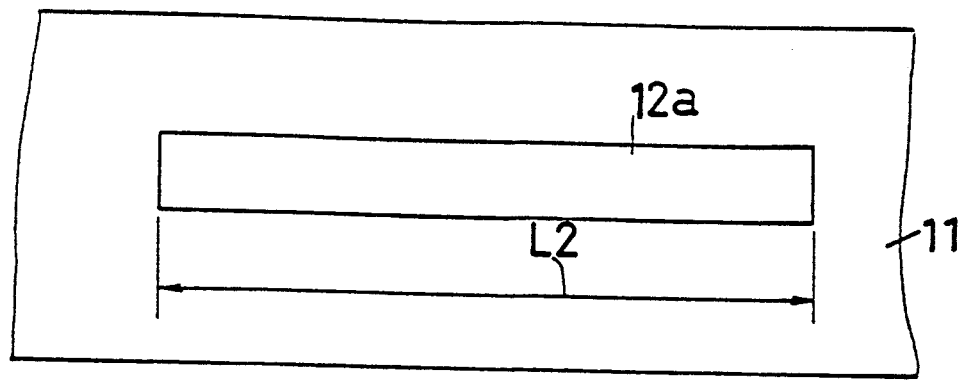
Fig.5 (5)
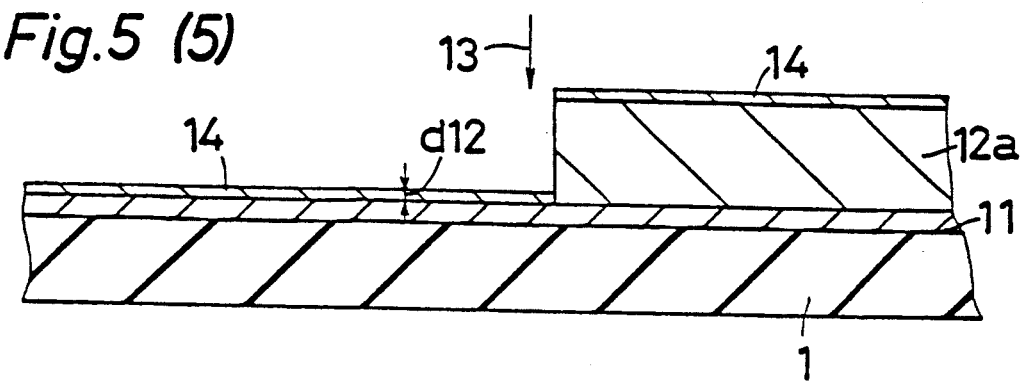
Fig.5 (6)
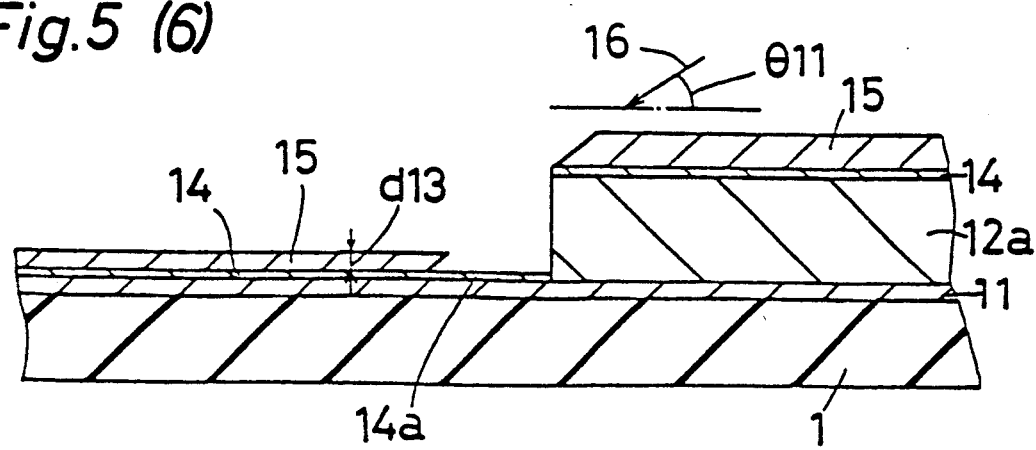

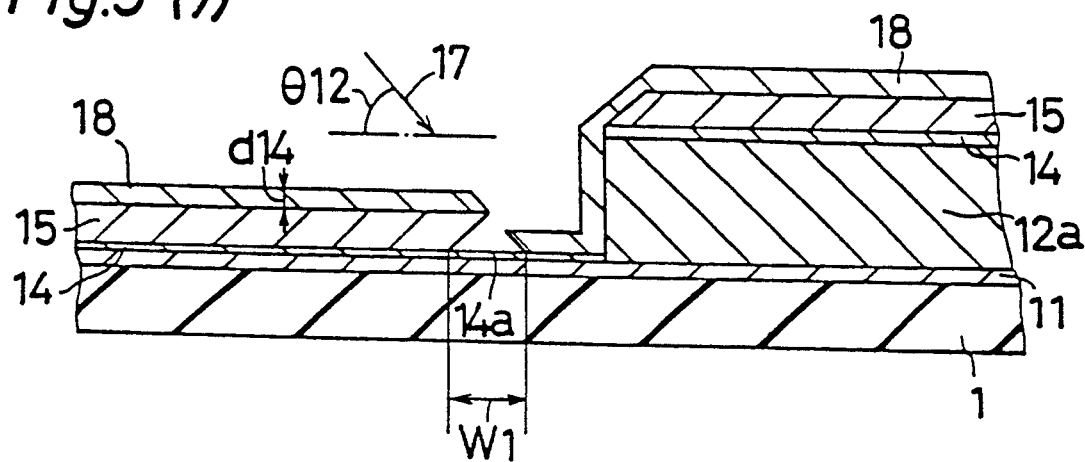
Fig.5 (7)
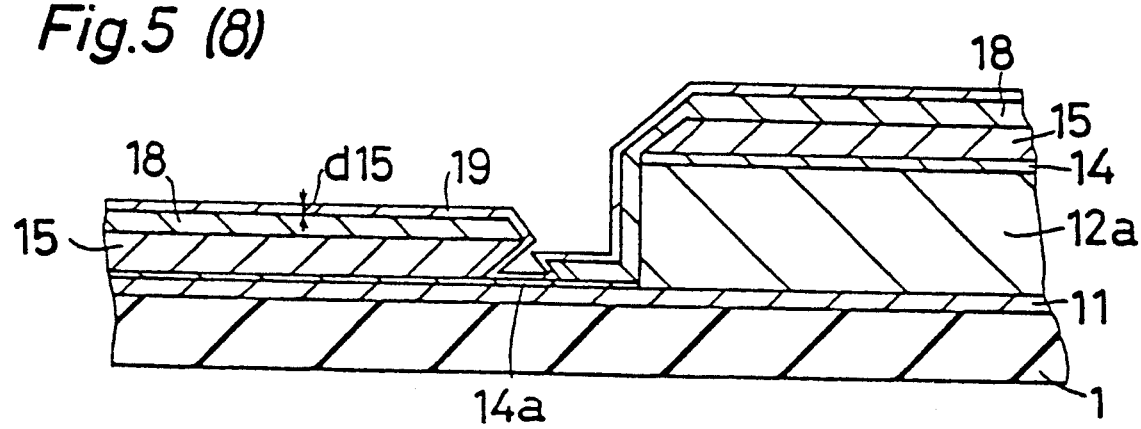
Fig.5 (8)

Fig.10 (1)
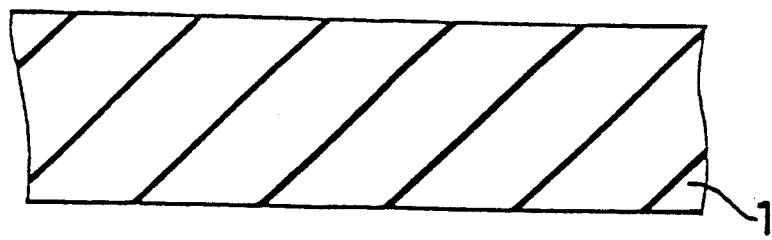
Fig.10 (2)
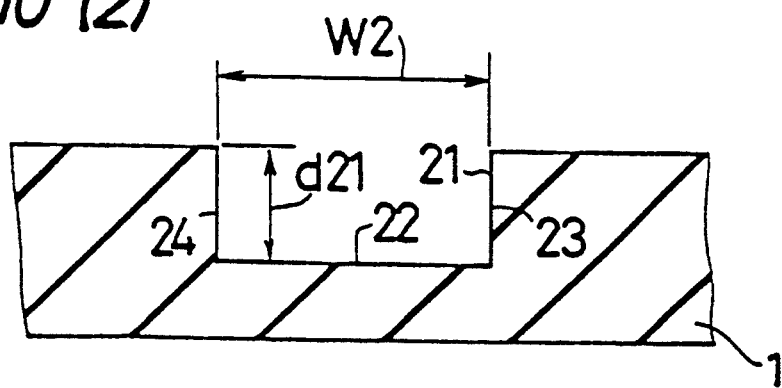
Fig.10 (3)
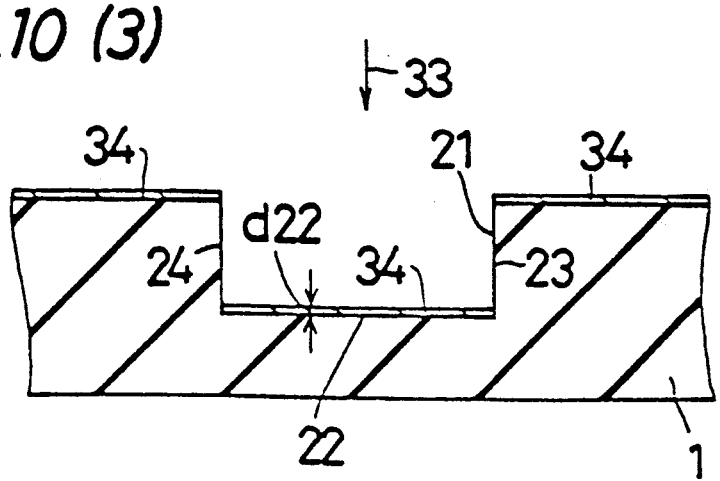

Fig.10 (4)
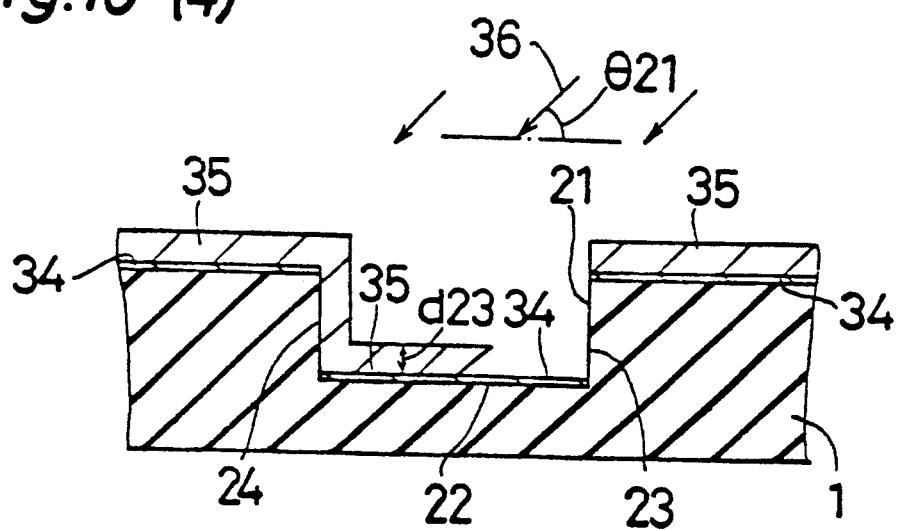
Fig.10 (5)
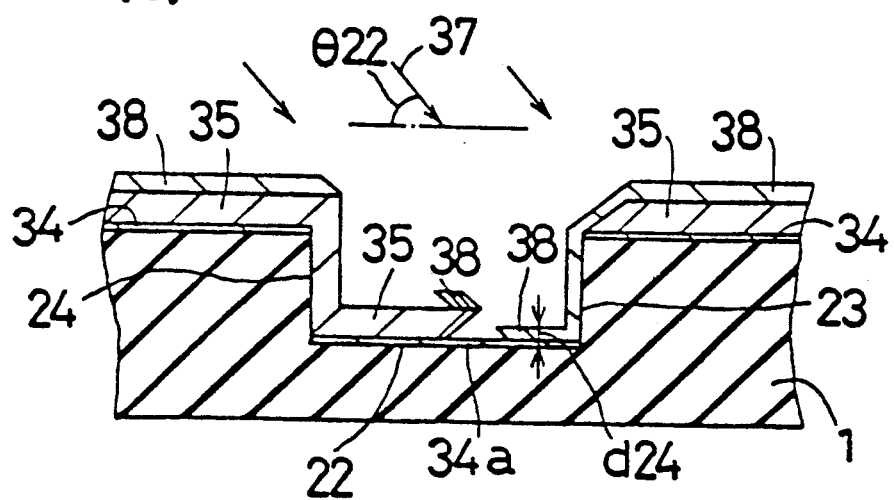

JOSEPHSON DEVICE FORMED OVER A RECESS STEP WITH PROTECTIVE LAYER

BACKGROUND OF THE INVENTION

1. Field of the Invention

The present invention relates to a superconductive Josephson device and a process for producing the same, more particularly to a Josephson device, such as a superconductive quantum interference device used as a sensor for measuring an extremely weak magnetic field, and a process for producing such a Josephson device.

2. Description of Prior Art

A superconducting quantum interference device includes a superconductive ring that couples with one or two Josephson junctions, and is used for measuring a magnetic field generated from the heart, eye ball, brain, and like organisms of the human body, and is abbreviated to a superconductive quantum interference device (hereafter reference to as SQUID).

The SQUID serves as a sensor for measuring such the extremely weak magnetic fields as are generated from the organisms. However, production of the device including the Josephson junction is conducted with the use of a fine processing technique, and the performance as a sensor directly depends on the error in the shape of the device after processing. Further, superconductive material to be used is material which will be oxidized over time while being used. When the superconductive material in use is oxidized, it affects the performance of the device as a sensor as much as deformation of the Josephson junction. Therefore, it is difficult to maintain the initial performance of the device when produced over time.

Conventionally, a surface portion of the Josephson junction is oxidized in advance to protect the Josephson junction from the atmosphere, thereby forming an oxide film on the surface portion. However, in the case where oxide is formed on the surface portion, oxygen progressively diffuses over time in a thin film layer of superconducting material, for example, Nb. As a result, there arises a problem in that a property of the device changes due to the reduced thickness of the Nb thin film.

The prior art covers the surface portion with synthetic resin material. In this prior art, a thermal expansion coefficient of the synthetic resin material differs greatly from that of the superconducting material. Accordingly, upon being subjected to a thermal hysteresis from liquid helium at a temperature of 4.2° K. to ordinary temperature, minute cracks are caused in the synthetic resin material, whereby the SQUID is deteriorated.

In order to solve the foregoing problem and isolate the SQUID from the oxidized atmosphere, it can be considered to retain the SQUID in an atmosphere of inert gas, such as $N_2$. However, this is not practical because it is difficult to prevent the leak.

Further, in the existing SQUIDS, it is difficult to form a uniform and exceedingly thin film of about 100 to 200 Å in consideration of the current fine processing technique. Moreover, in the existing SQUIDS, it is extremely difficult to fabricate with minute length and width accurately and with satisfactory reproducibility in a processing which determines the size and shape of the junction. Therefore, the defect rate in production of the SQUID is extremely high.

SUMMARY OF THE INVENTION

It is an object of the present invention to provide a high sensitivity Josephson device that can be readily produced and can improve the properties of a Josephson junction by reliably preventing oxidization and age deterioration of superconducting layers, and a process for producing such a Josephson device.

Accordingly, a Josephson device of the invention is characterized in that a thin film region consisting of superconducting material is formed on a substrate, and a covering layer consisting of ordinary conducting metal or semiconductor is formed on the thin film region and a neighboring region thereof.

The invention is also directed to a Josephson device characterized in that a layer consisting of ordinary conducting material is formed on a substrate, and a thin film region consisting of superconducting material is formed on the layer, thereby forming a Josephson junction.

The invention is further directed to a Josephson device characterized in that a recessed channel is formed in a substrate, and a thin film region consisting of superconducting material is formed on the bottom of the recessed channel, thereby forming a Josephson junction.

Moreover, the invention is directed to a process for producing a Josephson device having the features as defined above.

According to the invention, the thin film region consisting of the superconducting material formed on the substrate is, for example, a part of the Josephson junction, and the covering layer consisting of ordinary conducting metal or semiconductor is formed on the thin film region and the neighboring region thereof. This enables the thin film region to be isolated from the oxidized atmosphere, and thereby prevent the oxidization of the thin film region. In addition, the covering layer is not subject to deterioration such as cracks even upon being subjected to a thermal hysteresis from the very low temperature of liquid helium to ordinary temperature. Accordingly, the thin film region can be protected over a long period. The ordinary conducting metal constituting the covering layer is, for example, Cr or Ta. The semiconductor constituting the covering layer is, for example, Si.

Further, according to the invention, the layer consisting of ordinary conducting material is formed on the substrate, and the thin film region consisting of the superconducting material is formed on the ordinary conducting material layer, thereby obtaining a Josephson junction. Accordingly, the thin film region is formed on the clean layer, thereby reliably attaining the characteristics of a Josephson effect. Further, since the actual thickness of the thin film region can be made smaller due to the proximity effect, it is made possible to form a relative thick layer consisting of superconducting material. Therefore, such a thin film consisting of superconducting material can be easily produced.

Furthermore, according to the invention, the layer consisting of ordinary conducting material is further formed on the Josephson junction, thereby enabling the Josephson junction to be protected from the external atmosphere. In addition, the actual thickness of the Josephson junction can be controlled to be smaller due to the proximity effect.

The ordinary conducting material used for the layer formed on the substrate and the superconducting material used for the layer formed on the Josephson junction may be, for example, Cr or Ta, or may be superconducting material having a lower critical temperature than the superconducting material constituting the Josephson junction. The superconducting material having a lower critical temperature than the superconducting material for the Josephson junction is also included in the concept of the ordinary conducting material.

Moreover, according to the invention, the recessed channel is formed in the substrate, for example, by the use of a dry etching technique. The bottom of the recessed channel is clean, and a thin film region consisting of the superconducting material is formed on the bottom, thereby obtaining the Josephson junction. Accordingly, the Josephson device can be produced in a more simplified production process than the prior art.

Further, according to the invention, the thin film region realizing the Josephson junction is formed by depositing the superconducting material from oblique directions using the opposite side walls of the recessed channel, and thereby partially exposing the thin film already formed entirely over the bottom of the recessed channel to obtain the thin film region. In this way, the thin film region realizing the Josephson junction can be formed on the clean bottom of the recessed channel.

Also, according to the invention, a covering layer consisting of ordinary conducting metal or semiconductor is formed on the thin film region consisting of the superconducting material formed on the substrate and a neighboring region thereof. This enables the thin film region to be prevented from oxidizing. In addition, the covering layer does not deteriorate over time even upon being repeatedly subjected to a thermal hysteresis from a very low temperature to ordinary temperatures. In this way, a Josephson device can be realized whose characteristics are not to change over a long period.

Furthermore, according to the invention, due to the, proximity effect of the layer consisting of ordinary conducting material formed on the substrate and the layer consisting of ordinary conducting material formed on the Josephson junction, the actual thickness of the Josephson junction can be made thinner. This makes the characteristics of the Josephson effect satisfactory, thereby enabling the Josephson junction to have higher sensitivity. Further, since the thin film region forming the Josephson junction may be relatively thick, the production can be carried out easily.

Moreover, according to the invention, the recessed channel is formed in the substrate, and the thin film region consisting of superconducting material is formed on the bottom of the recessed channel, thereby obtaining the Josephson junction. Accordingly, the thin film region is formed on the clean bottom of the recessed channel. Therefore, there can be produced a Josephson device having excellent characteristics of the Josephson effect.

Since the recessed channel is formed in the substrate and the thin film is partially exposed to form the thin film region forming the Josephson junction by conducting the oblique deposition using the opposite side walls of the recessed channel, the production process of the invention can be simplified and the entire process can be carried out in the same vacuum. This causes the production of the Josephson device to be carried out further, more easily, and contamination of the surface of the substrate, including the bottom of the recessed channel, can be prevented.

BRIEF DESCRIPTION OF THE DRAWINGS

Other and further objects, features, and advantages of the invention will become more explicit from the following detailed description taken with reference to the drawings, wherein:

FIGS. 2(1) to 2(6) are sectional views showing a production process of the first embodiment shown in FIG. 1;

FIG. 4 is a sectional view of a second embodiment in accordance with the invention;

FIGS. 5(1) to 5(8) are sectional views showing a production process of the second embodiment shown in FIG. 4;

FIGS. 10(1) to 10(5) are sectional views showing a production process of the third embodiment shown in FIG. 9.

DETAILED DESCRIPTION OF THE PREFERRED EMBODIMENTS

Figure 1:
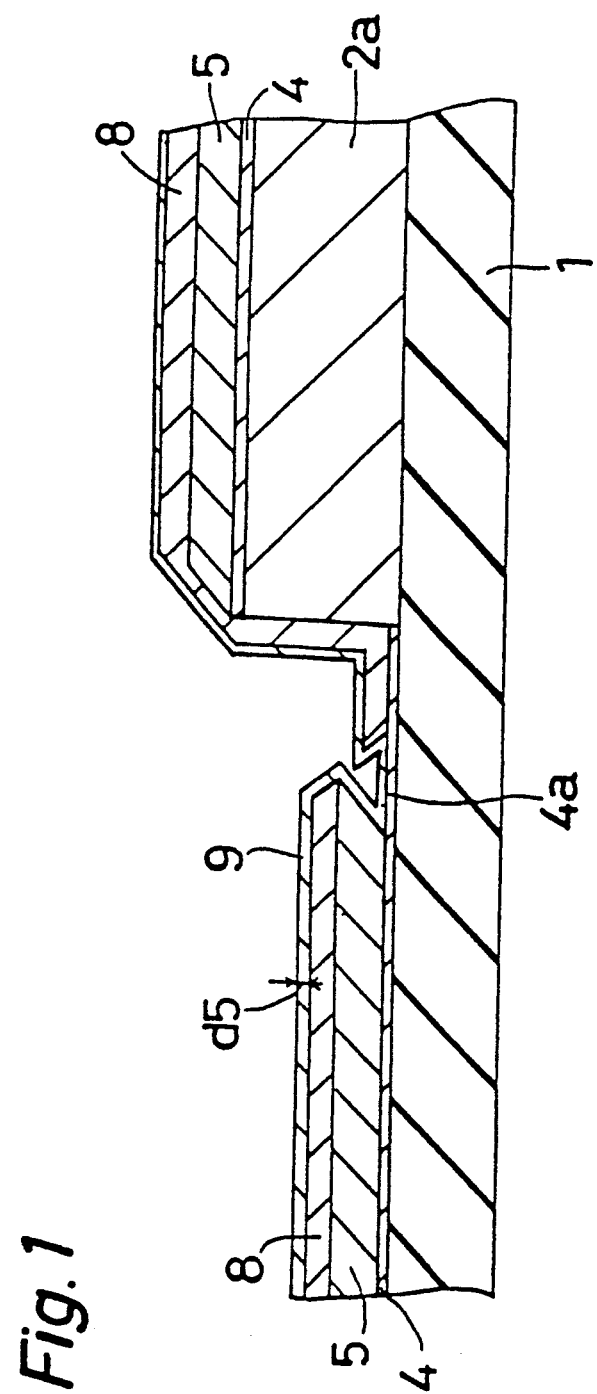
FIG. 1 is a sectional view of a first embodiment in accordance with the invention.

Now referring to the drawings, preferred embodiments of the invention are described below.

Embodiment 1

FIG. 1 is a sectional view part showing a superconductive quantum interference device, (SQUID) including a Josephson junction, of a first embodiment of the invention, and FIGS. 2(1) to 2(6) are sectional views showing a production process of the SQUID. With reference to these drawings, a substrate 1 consists of quartz, sapphire, Si, which is a semiconductor, and like material. A first layer 2 of thin film is formed over the entire upper surface of the substrate 1 by deposition or spatter technique as shown in FIG. 2(1). Material for the first thin film layer 2 may be, for example, Nb, which provides superconducting material, or Cr or Ta, which provides ordinary conducting material, or may be a nonmetallic material. Thickness d1 of the first thin film layer 2 is, for example, 100 to 200 Å.

The first thin film layer 2 has a portion thereof selectively removed therefrom by etching or the like, so that a long and narrow base 2a in the form of a step can be formed as shown in FIG. 2(2). FIG. 2(3) is a plan view showing the substrate 1 on which the base 2a is formed. The length L1 of the base 2a is, for example, 1 to 5 μM.

Next, as shown in FIG. 2(4), superconducting material such as Nb is deposited from a direction 3 perpendicular to the surface of the substrate 1, thereby forming a second layer 4 over the upper surfaces of the substrate 1 and the base 2a. Thickness d2 of the second layer 4 is, for example, 80 to 200 Å, preferably 80 to 150 Å, and more preferably 100 Å.

Thereafter, as shown in FIG. 2(5), superconducting material Nb is deposited from an arrow direction 6, thereby forming a third layer 5. Thickness d3 of the third layer 5 is, for example, 1000 Å. The depositing direction 6 makes an angle $\theta 1$ with respect to the surface of the substrate 1. The angle $\theta 1$ is, for example, between 25 and 70 degrees, and preferably between 25 and 50 degrees, and particles of superconducting material are supplied from the base 2a.

Subsequently, as shown in FIG. 2(6), superconducting material Nb is deposited from an arrow direction 7 on the third layer 5, thereby forming a fourth layer 8. Thickness d4 of the fourth layer 8 is, for example, 500 Å, and a sum of the thickness d3 and d4 is, for example, 200 to 2000 Å. In this way, a thin film region 4a is formed which is not covered by either the third layer 5 or the fourth layer 8. The Josephson junction is formed on the thin film region 4a.

Figure 3:
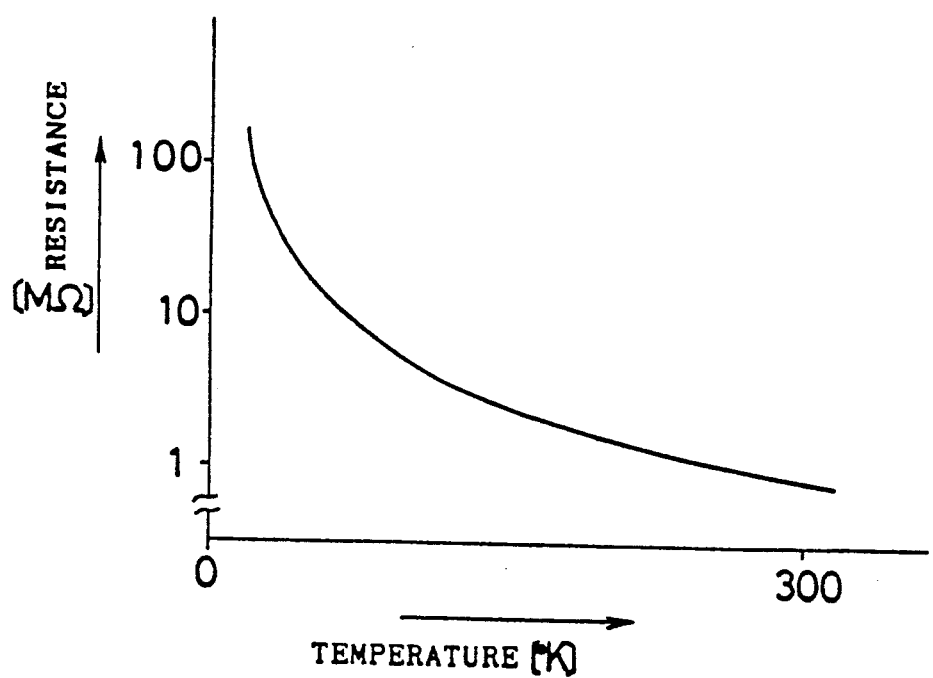
FIG. 3 is a graph showing the temperature dependency of the resistance of the Si constituting a covering layer 9.

At the last stage, a covering layer 9 consisting of conducting or semiconducting material is formed on the fourth layer 8 and the thin film region 4a by the use of a spatter technique as shown in FIG. 1. The conducting material constituting the covering layer 9 is, for example, metallic material such as Cr and Ta. On the other hand, the semiconducting material constituting the covering layer 9 is, for example, Si. Particularly, it is preferable that the covering layer 9 consists of Si since temperature dependency of resistance of Si has such characteristics that electric resistance becomes substantially infinite at very low temperatures as shown in FIG. 3.

As shown in FIGS. 2(5) and 2(6), the third and fourth layers 5 and 8 are formed by the use of an oblique deposition technique, so to speak, and results in the thin film region 4a on which the Josephson junction is formed. Thereafter, the covering layer 9 is formed, whereby the thin film region 4a and the third and fourth layers 5 and 8 are isolated by the covering layer 9 from the external atmosphere. The conducting or semiconducting material constituting covering layer 9 has a thermal expansion coefficient similar to that of the second, third, and fourth layers 4, 5 and 8. Accordingly, even in the case where the SQUID is repeatedly subjected to a thermal hysteresis from the very low temperature of, such as, liquid helium to the ordinary temperature, there is no such likelihood that minute cracks are caused in the covering layer 9.

In the foregoing embodiment, the thin film region 4a is formed using the oblique deposition technique. However, the thin film region 4a having the Josephson junction formed thereon may be formed by other techniques.

According to an experiment conducted by an inventor of this application, it is confirmed that the property of the Josephson effect can be maintained over a long period when the thickness d2 of the second layer 4 is set to 80 Å, the sum of the thickness d3 and d4 of the third and fourth layers 5 and 8 in the neighborhood of the thin film region 4a having the Josephson junction formed thereon is set to 200 to 2000 Å, and the thickness d5 of the covering layer 9, consisting of Cr, which provides ordinary conducting material, is set equal to 100 Å. On the contrary, a comparative example wherein the covering layer 9 consists of niobium oxide, and the thickness thereof is set to 100 Å, exhibits a maintaining period of the characteristics of the Josephson effect shorter than that of the invention.

Embodiment 2

FIG. 4 is a partial sectional view of a superconductive quantum interference device of another embodiment in accordance with the invention, and FIGS. 5(1) to 5(8) are sectional views showing a production process of the SQUID. A substrate 1 shown in FIG. 5(1) consists of quartz, sapphire, semiconductor, such as Si, similar to the substrate 1 shown in the first embodiment. A first layer 11 consisting of ordinary conducting material is formed on the substrate 1. The ordinary conducting material constituting the first layer 11 may be Cr or Ta. Alternatively, the first layer 11 may consist of superconducting material, such as Pb, having a low critical temperature lower than the critical temperature of a second layer 14 which forms a Josephson junction 14a a thin film region to be described hereinafter. Thickness d10 of the first layer 11 is, for example, 100 to 200 Å.

Subsequently, a thin layer 12 is formed entirely over the first layer 11 as shown in FIG. 5(2). The thin layer 12 may consist of ordinary conducting material, for example a metallic material such as Cr and Ta. Alternatively, the thin layer 12 may consist of nonmetallic material or superconducting material such as Nb. Thickness d11 of the thin layer 12 is, for example, 100 to 200 Å. After formation of the thin layer 12, the first layer 12 is processed into the form of a long and narrow step by etching or the like, thereby forming a base 12a as shown in FIG. 5(3). FIG. 5(4) is a plan view showing the substrate 11 on which the base 12a is formed. The length L2 of the base 2a is, for example, 1 to 5 $\mu$m.

Thereafter, as shown in FIG. 5(5), a second layer 14 is formed by deposition in an arrow direction 13. The arrow direction 13 is perpendicular to the surface of the substrate 1, i.e., the first layer 11. The second layer 14 consists of superconducting material, for example, Nb. Thickness d12 of the second layer 14 is, for example, 300 to 500 Å, and may be relatively large.

Subsequently, as shown in FIG. 5(6), a third layer 15 is formed by deposition from an arrow direction 16. The third layer 15 consists of superconducting material Nb. An angle $\theta 11$ made by the arrow direction 16 with respect to the surface of the second layer 14 is, for example, between 25 and 70 degrees, and preferably between 25 and 50 degrees. Thickness d13 of the third layer 15 is, for example, 1000 Å.

As shown in FIG. 5(7), a fourth layer 18 is formed by deposition from an arrow direction 17. The fourth layer 18 consists of superconducting material Nb, and the thickness d14 thereof is, for example, 500 Å. A sum of the thickness d13 and d14 is selected to be 200 to 2000 Å. An angle $\theta 2$ made by the arrow direction 17 with respect to the surface of the second layer 14 is between 25 to 70 degrees, and preferably between 25 and 50 degrees. In this way, as shown in FIGS. 5(6) and 5(7), the third and fourth layers 15 and 18 are formed by the oblique deposition technique, so to speak, from the directions 16 and 17 from opposing sides, whereby the second layer 14 is partially exposed, forming a thin film region 14a. As a consequence, the Josephson junction can be obtained.

At the last stage, as shown in FIG. 5(8), a fifth layer 19 is formed entirely over the surfaces of the Josephson junction 14a and the third and fourth layers 15 and 18 by the use of a spatter technique. Thickness d15 of the fifth layer 19 is, for example, 100 to 200 Å, and consists of material similar to the first layer 11. More specifically, the fifth layer 19 consists of Cr, Ta, or other ordinary conducting material, or a superconducting material such as Pd having a low critical temperature lower than the critical temperature of the superconducting material constituting the second layer 14. In this way, there can be obtained a configuration as shown in FIG. 5(8), i.e. the configuration shown in FIG. 4.

By conducting the oblique deposition from the two directions 16 and 17 shown respectively in FIGS. 5(6) and 5(7), it is made possible to fabricate the Josephson junction 14a with high accuracy so that a width W1 thereof (see FIG. 5(7)) can be set to, for example, 1 μm. Further, as shown in FIGS. 5(3) and 5(4), the Josephson junction 14a having a length equal to the length L2 of the base 12a can be fabricated with high accuracy. In this way, the Josephson junction 14a can be fabricated by controlling the width W1 and the length L2 thereof with high accuracy in a simple production process. Further, the width W1 of the Josephson junction 14a can be set to a desired value by changing the angles $\theta 11$ and $\theta 12$ of the arrow directions 16 and 17 with respect to the surface of the second layer 14 in the oblique deposition technique. More specifically, in the oblique deposition technique, the angles $\theta 11$ and $\theta 12$ made by the arrow directions 16 and 17 can be changed easily in a desired manner, and therefore adjustment of an optimum shape of the SQUID can be easily performed. In other words, the oblique deposition technique is excellent in controllability for forming the Josephson junction 14a of the SQUID with accurate length L2 and width W1, thereby improving processability thereof.

The Josephson junction 14a is a sandwich structure having three layers, including the first, second, and fifth layers 11, 14 and 19. The invention has excellent advantages in that the oblique deposition technique can be applied to a Josephson device having such a structure. Specifically, this Josephson device provides a construction suitable for drawing advantageous features from the oblique deposition technique.

Figure 6:
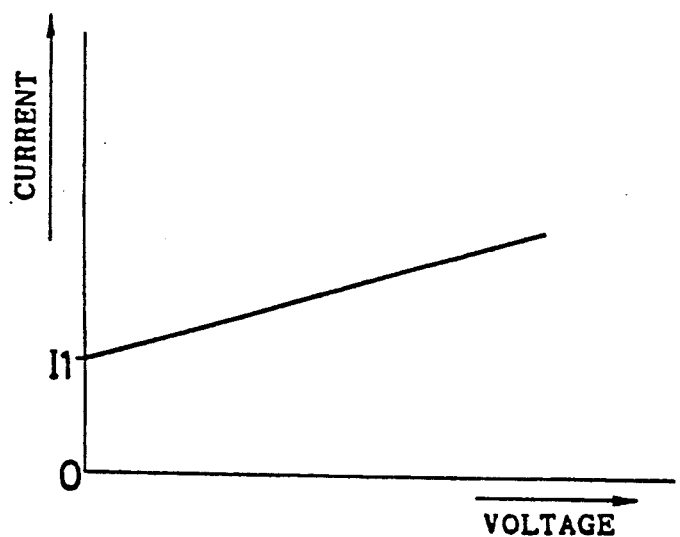
FIG. 6 is a graph showing I-V characteristics of a superconductive quantum interference device.

FIG. 6 is a graph showing I-V characteristics of the superconductive quantum interference device shown in FIGS. 4 and 5. In order to make smaller a maximum current obtainable in the superconductive state, i.e., a critical current I1, it is required to make the Josephson junction 14a thin. However, the SQUID is subject to more bad influences, depending on stains thereon, when the thickness thereof is made thinner. Moreover, it is very difficult to form such a thin second layer 14. In the foregoing embodiment, the second layer 14 is formed relatively thin, and sandwiched between the first and fifth layers 11 and 19. Accordingly, the Josephson junction 14a looks substantially thick due to the proximity effect, thereby enabling the critical current I1 to decrease.

Figure 7:
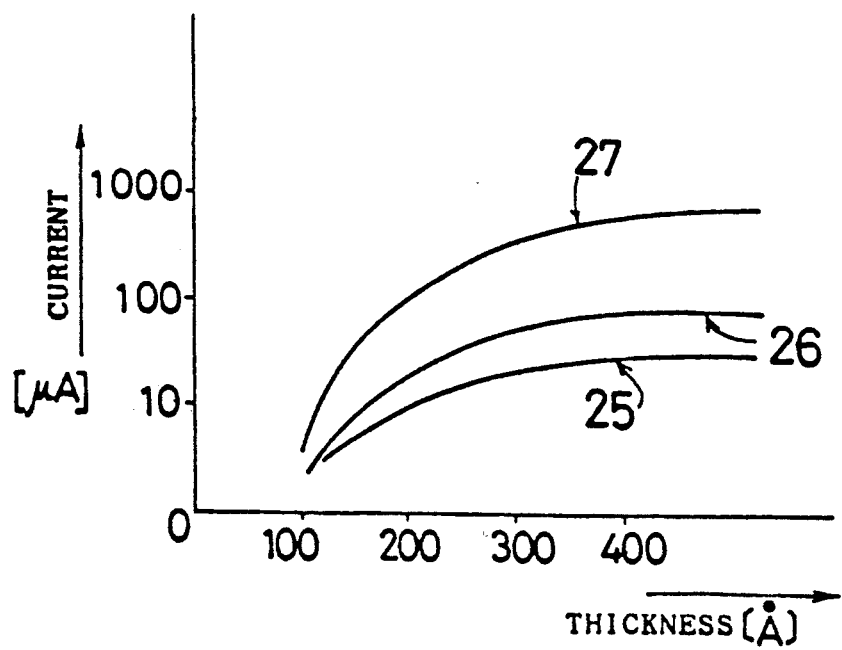
FIG. 7 is a graph showing the relationship between a thickness d11 of a Josephson region 14a and a current I1, which is an experimental result obtained by the inventors.
Figure 8:
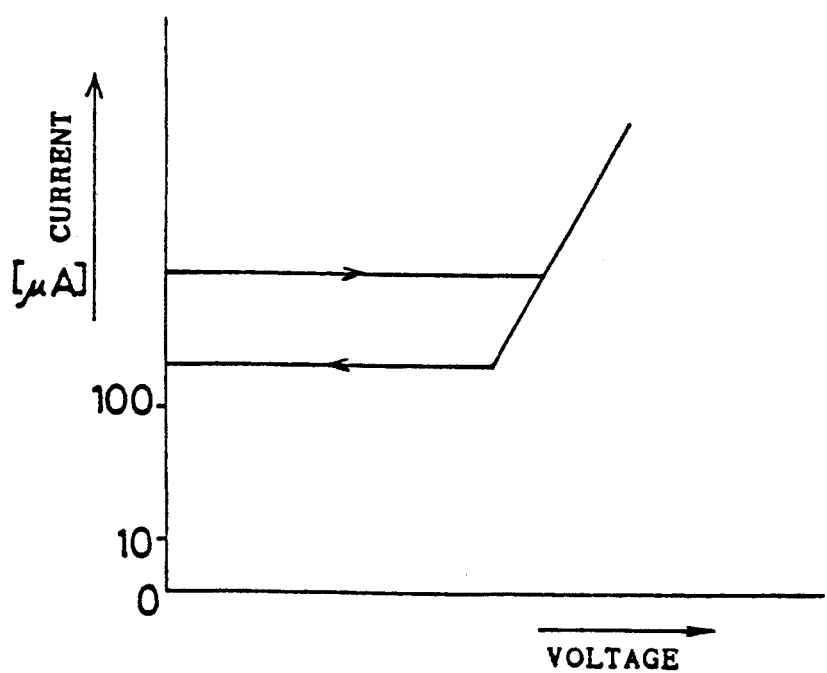
FIG. 8 is a graph showing I-V characteristics when the thickness of a first, second, and fifth layers 11, 14 and 18 are set 200 Å, respectively to d10, d11 and d15, which is an experimental result obtained by the inventors.
Figure 11:
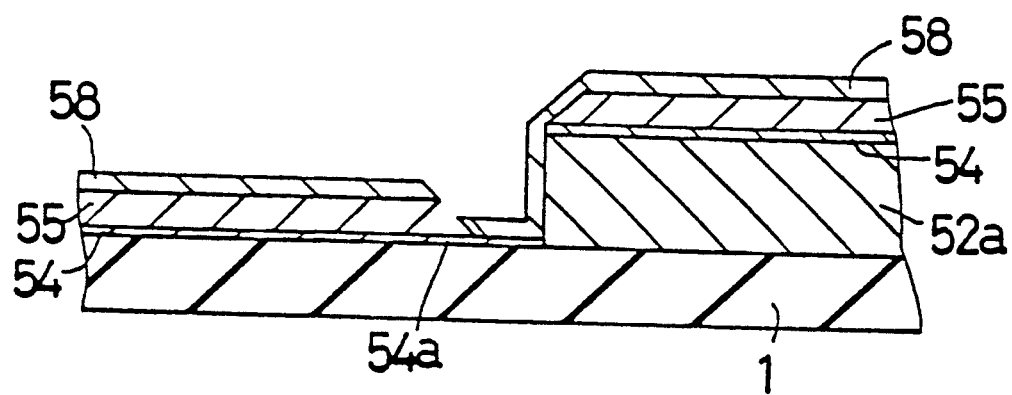
FIG. 11 is a sectional view showing a superconductive quantum interference device of the prior art.

FIG. 7 is a graph showing an experimental result obtained by the inventors. A line 25 in FIG. 7 represents characteristics of the SQUID shown in FIGS. 4 and 5. A line 26 represents characteristics of another embodiment of the invention in which the fifth layer 19 is omitted, and a Josephson junction 14a is formed on a first layer 11. A line 27 represents the characteristics of an existing SQUID for comparison, in which a Josephson junction 54 is formed directly on a substrate 1 shown in FIG. 11, and a first and a fifth layers 11 and 19 are omitted. It is generally preferable that the critical current I1 ranges from 10 to 120 μA. In order to attain such a relatively small critical current I1, as represented by the lines 25 and 26, it will be understood that the rate of change in the critical current I1 is small even if the thickness d12 of the Josephson junction 14a varies greatly in construction according to the present invention. Therefore, according to the invention, it is made possible to easily control the critical current I1 of the SQUID so as to make it smaller.

As another embodiment of the invention, the fifth layer 19 may be omitted from the construction.

According to another experiment conducted by the inventor of this application, when the first and fifth layers 11 and 19 consist of Ta and Cr, the second, third and fourth layers 14, 15 and 18 consist of Nb of a purity of 99.9%, the thickness d10 and d15 of the first and fifth layers 11 and 19 is set to 100 Å, the thickness of the second layer 14 on which the Josephson junction 14a is formed is set to 100 Å, and the angles $\theta 11$ and $\theta 12$ are selected to be between 25 and 50 degrees, it is confirmed that a defect rate at the time of production of the SQUID, which can obtain a preferable critical current I1 of 10 to 100 μA, is improved more than that of the prior art in which the first and fifth layers 11 and 19 as described above are not provided. When the critical current I1 is 100 μA, an output voltage thereof is about 10 μV.

When the thickness d10, d11 and d15 of the first, second, and fifth layers 11, 14 and 19 is set to 200 Å, with other conditions being equal to the foregoing ones, it is also confirmed that the defect rate is maintained at a preferable level. At this time, the critical current I1 is 120 μA, and the output voltage thereof is 9 μV.

Embodiment 3

Figure 9:
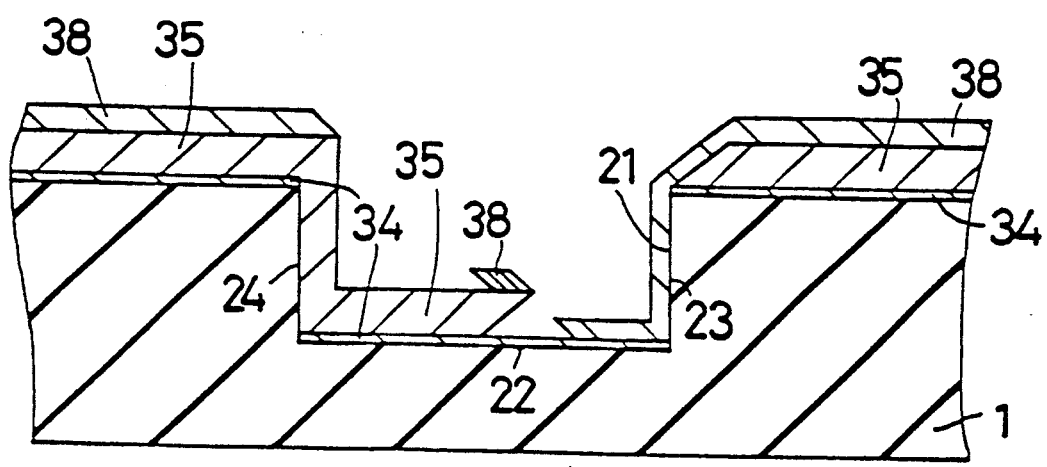
FIG. 9 is a sectional view of a superconductive quantum interference device of a third embodiment in accordance with the invention.

FIG. 9 is a sectional view partially showing a superconductive quantum interference device of still another embodiment of the invention, and FIGS. 10(1) to 10(5) are sectional views showing a production process of the superconductive quantum interference device. A substrate 1 consists of quartz, sapphire, and semiconducting material such as Si, similar to the substrate 1 shown in the first embodiment. Such, substrate 1 is prepared as shown in FIG. 10(1).

Subsequently, a recessed channel 21 is formed in the substrate 1 as shown in FIG. 10(2). The recessed channel 21 has a bottom 22 and opposite side walls 23 and 24. The side walls 23 and 24 of the recessed channel 21 are positioned perpendicularly to the bottom 22. The recessed channel 21 may be, for example, formed by the use of a dry etching technique. Depth d21 of the channel 32 is, for example, 4000 to 5000 Å, width W2 thereof is, for example, 1 μm, and length L3 thereof, in a direction vertical to the plane of the drawing in FIG. 10(2) m y be, for example, 1 to 5 μm, similar to the lengths L1 and L2 of the first and second embodiments.

The dry etching technique may be, for example, the spatter technique by which a resist layer having a hole corresponding to the channel 21 is formed on the surface of the substrate 1, and argon ions Ar+ are rendered to crash in a plasma atmosphere.

Thereafter, as shown in FIG. 10(3), superconducting material such as Nb is deposited on the recessed channel 21 from above as indicated by an arrow 33, i.e., a direction perpendicular to the bottom 22 of the channel 21, thereby forming a first layer 34. The first layer 34 is also formed on the surface of the substrate 1 besides the surface of the recessed channel 21. Thickness d22 of the first layer 34 is 80 to 200 Å, preferably 80 to 150 Å, and more preferably 100 Å. The superconducting material Nb is deposited on the first layer 34 from an arrow direction 36, thereby forming a second layer 35 as shown in FIG. 10(4). The deposition of the superconducting material Nb from the arrow direction 36 is interrupted by one side wall 23, and therefore the second layer 35 is formed on a part of the first layer 34 on the bottom 22 of the recessed channel 21. An angle $\theta 21$ made by the arrow direction 36 with respect to the surface of the bottom 22 is, for example, between 25 and 70 degrees, and preferably between 25 and 50 degrees. Thickness d23 of the second layer 35 is, for example, 1000 Å.

Thereafter, as shown in FIG. 10(5), superconducting material Nb is deposited on the surface of the first layer 34 from an arrow direction 37 so as to form a third layer 38. In this case, the deposition is interrupted by the other side wall 24, whereby the third layer 38 is formed on another part of the first layer 34 on the bottom 22 where the second layer 35 is not formed. Thickness d24 of the third layer 38 is, for example, 500 Å, and a sum of the thickness d23 and d24 is selected to be, for example, 200 to 2000 Å. An angle $\theta 22$ made by the arrow direction 37 with respect to the surface of the bottom 22 is between 25 and 70 degrees, and preferably between 25 and 50 degrees. In this way, on the first layer 34 is formed a thin film region 34a a partially exposed region formed by the second and third layers 35 and 38, and thereby a Josephson junction can be obtained. In this manner, an oblique deposition is conducted from opposite sides of the recessed channel 21 as indicated by the arrow directions 36 and 37 by using the opposite side walls 23 and 24 of the recessed channel 21, whereby the thin film region 34a serving as a Josephson junction is formed. By changing the deposition angles $\theta 21$ and $\theta 22$, the depth d21 of the recessed channel 21, and the thicknesses 23 and d24 of the second and third layers 35 and 38, the shape and characteristics of the Josephson junction can be freely controlled.

This production process can be carried out entirely in the same vacuum, which in turn prevents any surface of the substrate 1, including the recessed channel 21, from being stained. Therefore, the production is easier and more convenient.

According to another experiment conducted by the inventors, when a recessed portion 21 having the depth d21 of 4000 Å was formed on a Si substrate 1, Nb was used as superconducting material, and a superconductive quantum interference device was produced by setting the thicknesses d22, d23, and d24 of the first, second, and third layers 34, 35 and 38 to 100Å, 1000 Å, 500 Å, respectively, and deposition angles $\theta 21$ and $\theta 22$ between 30 and 70 degrees, a critical current was 10 $\mu$A and an output voltage thereof was 10 $\mu$V, whereupon appropriate characteristics could be obtained.

Further, when the thickness d22 of the first layer 34 was set to 200 Å, with other conditions being equal to the foregoing ones, the critical current was 18 $\mu$A and the output voltage thereof was 7 $\mu$V, whereupon appropriate characteristics could again be obtained.

It will be understood that the invention can be embodied not only in a superconductive quantum interference device, but also in other Josephson devices.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and the range of equivalency of the claims are therefore intended to be embraced therein.

What is claimed is:

1. A Josephson device, comprising:
   a substrate;
   a rectangular base disposed on part of said substrate, said rectangular base having a sidewall;
   a thin film region formed of superconducting material disposed adjacent to said sidewall of said rectangular base so as to form a Josephson junction, said thin film region being formed by:
   a first thin film layer formed on said substrate,
   a second thin film layer formed on said first thin film layer having a surface thereon which extends in a direction approaching toward said substrate and going away from said rectangular base; and
   a third thin film layer formed on said first thin film layer having a sidewall surface which extends in a direction approaching toward said substrate and going toward said rectangular base, said third thin film layer being further formed on said second thin film layer and said sidewall of said rectangular base, said third thin film layer being thinner than said first thin film layer;
   wherein said substrate is made of a semiconducting material, and has a layer of ordinary conducting metal thereon between said semiconducting material and said first thin film layer.

2. The Josephson device of claim 1, and further comprising a covering layer comprising one of an ordinary conducting metal and a semiconductor material covering said thin film region.

3. The Josephson device of claim 2, wherein said superconducting material is niobium.

4. The Josephson device of claim 1, wherein said superconducting material is niobium.

5. A Josephson device, comprising:
   a substrate having an upper surface and a recessed channel formed in said upper surface, said recessed channel having a bottom surface parallel with said upper surface of said substrate and sidewalls perpendicular to said upper surface of said substrate;
   a thin film region formed of superconducting material on the bottom surface of said recessed channel, said thin film region being defined by:
   a first thin film layer formed on said bottom surface of said recessed channel;
   a second thin film layer formed on said first thin film layer having a surface thereon which extends in a direction approaching toward said bottom surface of said recessed channel and going away from one said sidewall of said recessed channel; and
   a third thin film layer formed on said first thin film layer in said recessed channel and on said second thin film layer, said third thin film layer having a sidewall surface which extends in a direction going toward said substrate and going toward the one said sidewall of said recessed channel;
   wherein said third thin film layer is thinner than said second thin film layer.

6. The Josephson device of claim 5, wherein said superconducting material is niobium.

7. A Josephson device, comprising:
   a substrate having an upper surface;
   a base having a sidewall supported by said upper surface of said substrate;

a first thin film of superconducting material supported by said substrate adjacent to said sidewall of said base and on an upper surface of said base;

a second thin film of superconducting material disposed on said first thin film such that an area adjacent to said sidewall of said base does not have said second film on said first film, said area being partially defined by a sidewall surface of said second thin film extending towards said substrate and away from said sidewall of said base;

a third thin film of superconducting material disposed on said second thin film, along said sidewall of said base and on a portion of said area of said first thin film adjacent to said base such that said third thin film has a sidewall surface opposite to and spaced from said sidewall surface of said second thin film, said sidewall surface of said third thin film extending toward said substrate and toward said sidewall of said base, whereby a thin film region of said superconducting material of said first thin film is defined between said sidewall surfaces of said second and third thin films; and a further layer of material selected from the group consisting of an ordinary conducting metal and a semiconductor material disposed on said first thin film at said thin film region.

8. The Josephson device of claim 7, wherein said further layer of material covers an upper surface of said first thin film at said thin film region, said sidewall surfaces of said second and third thin films and upper surfaces of said second and third thin films.

9. The Josephson device of claim 8, wherein said further layer is Si.

10. The Josephson device of claim 8, wherein an additional layer is provided interposed between said first thin film and said substrate, said additional layer made of material selected from the group consisting of an ordinary conducting material and a superconducting material having a critical temperature lower than the critical temperature of said first thin film.

11. The Josephson device of claim 10, wherein said superconducting material is niobium.

12. The Josephson device of claim 7, wherein and additional layer is provided interposed between said first thin film and said substrate, said additional layer made of material selected from the group consisting of an ordinary conducting material and a superconducting material having a critical temperature lower than the critical temperature of said first thin film.

13. The Josephson device of claim 12, wherein said superconducting material is niobium.

14. The Josephson device of claim 7, wherein said superconducting material is niobium.

15. A Josephson device, comprising:
a substrate having an upper surface;
a base having a sidewall supported by said upper surface of said substrate;
a first thin film of superconducting material supported by said substrate adjacent to said sidewall of said base and on an upper surface of said base;
a second thin film of superconducting material disposed on said first thin film such that an area adjacent to said sidewall of said base does not have second film on said first thin film, said area being partially defined by a sidewall surface of said second thin film extending towards said substrate and away from said sidewall of said base;
a third thin film of superconducting material disposed on said second thin film, along said sidewall of said base and on a portion of said area of said first thin film adjacent to said base such that said third thin film has a sidewall surface opposite to and spaced from said sidewall surface of said second thin film, said sidewall surface of said third thin film extending toward said substrate and toward said sidewall of said base, whereby a thin film region of said superconducting material of said first thin film is defined between said sidewall surface of said second and third thin films; and
an additional layer interposed between said first thin film and said substrate, said additional layer made of material selected from the group consisting of an ordinary conducting material and a superconducting material having a critical temperature lower than the critical temperature of said first thin film.

16. The Josephson device of claim 15, wherein said additional layer comprises Pb.

17. The Josephson device of claim 16, wherein said superconducting material of said first, second and third thin films is niobium.

18. The Josephson device of claim 15, wherein said superconducting material of said first, second and third thin films is niobium.

19. A Josephson device, comprising:
a substrate having an upper surface and a recessed channel in said upper surface, said recessed channel having a bottom surface parallel to said upper surface and sidewalls perpendicular to said upper surface of said substrate;
a first thin film of superconducting material on said bottom surface of said recessed channel;
a second thin film of superconducting material disposed on said upper surface of said substrate, along one said sidewall of said recessed channel, and on a portion of said first thin film on said bottom surface of said recessed channel, said second thin film having a sidewall surface extending in a direction toward said substrate and away from the other said sidewall of said recessed channel, and an area of said first thin film on said bottom surface being uncovered by said second thin film; and
a third thin film layer of superconducting material disposed on said second thin film layer, along the other said sidewall of said recessed channel and on part of said area of said first thin film such that said third thin film has a sidewall surface, spaced from and opposite to said sidewall surface of said second thin film layer on said first thin film layer, which extends in a direction towards said substrate and towards the other said sidewall of said recessed channel, whereby a thin film region of said superconducting material of said first thin film is defined between said sidewall surfaces of said second and third thin films.

20. The Josephson device of claim 19, wherein said superconducting material is niobium.

* * * * *